(12) United States Patent
Guan et al.

(10) Patent No.: US 12,142,696 B2
(45) Date of Patent: Nov. 12, 2024

(54) THIN FILM TRANSISTOR, DISPLAY APPARATUS, AND METHOD OF FABRICATING THIN FILM TRANSISTOR

(71) Applicant: BOE Technology Group Co., Ltd., Beijing (CN)

(72) Inventors: Feng Guan, Beijing (CN); Yichi Zhang, Beijing (CN); Yang Lv, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 527 days.

(21) Appl. No.: 17/599,688

(22) PCT Filed: Dec. 21, 2020

(86) PCT No.: PCT/CN2020/137869
§ 371 (c)(1),
(2) Date: Sep. 29, 2021

(87) PCT Pub. No.: WO2022/133631
PCT Pub. Date: Jun. 30, 2022

(65) Prior Publication Data
US 2022/0399465 A1 Dec. 15, 2022

(51) Int. Cl.
*H01L 29/786* (2006.01)
*H01L 29/45* (2006.01)
*H01L 29/66* (2006.01)

(52) U.S. Cl.
CPC ...... *H01L 29/78696* (2013.01); *H01L 29/458* (2013.01); *H01L 29/66765* (2013.01); *H01L 29/78669* (2013.01); *H01L 29/78678* (2013.01)

(58) Field of Classification Search
CPC ............. H01L 29/78696; H01L 29/458; H01L 29/66765; H01L 29/78669; H01L 29/78678; H01L 29/66757
See application file for complete search history.

(56) References Cited

U.S. PATENT DOCUMENTS

| 2013/0049004 A1 | 2/2013 | Sugawara |
| 2019/0088788 A1 | 3/2019 | Ban et al. |

(Continued)

FOREIGN PATENT DOCUMENTS

| CN | 103109360 A | 5/2013 |
| CN | 109390412 A * | 10/2014 |

(Continued)

OTHER PUBLICATIONS

International Search Report & Written Opinion mailed Sep. 26, 2021, regarding PCT/CN2020/137869.

(Continued)

*Primary Examiner* — Timor Karimy
(74) *Attorney, Agent, or Firm* — Intellectual Valley Law, P.C.

(57) ABSTRACT

A thin film transistor is provided. The thin film transistor includes abase substrate; a gate electrode on the base substrate; an active layer on the base substrate, the active layer including a polycrystalline silicon part including a polycrystalline silicon material and an amorphous silicon part including an amorphous silicon material; a gate insulating layer insulating the gate electrode from the active layer; a source electrode and a drain electrode on the base substrate; and an etch stop layer on a side of the polycrystalline silicon part away from the base substrate. An orthographic projection of the etch stop layer on the base substrate covers an orthographic projection of the polycrystalline silicon part on the base substrate, and an orthographic projection of at least a portion of the amorphous silicon part on the base substrate.

13 Claims, 9 Drawing Sheets

(56) References Cited

U.S. PATENT DOCUMENTS

| | | |
|---|---|---|
| 2019/0259879 A1 | 8/2019 | He et al. |
| 2020/0135931 A1* | 4/2020 | Qian ................. H01L 29/78609 |
| 2021/0226065 A1 | 7/2021 | Cao et al. |
| 2021/0234048 A1 | 7/2021 | Ohta et al. |

FOREIGN PATENT DOCUMENTS

| | | |
|---|---|---|
| CN | 107482066 A | 12/2017 |
| CN | 108735819 A | 11/2018 |
| CN | 109300916 A | 2/2019 |
| CN | 110073496 A | 7/2019 |
| CN | 111162129 A | 5/2020 |
| KR | 20140120415 A | 10/2014 |
| WO | 2019234890 A | 12/2019 |

OTHER PUBLICATIONS

R. Mochii et al., "P-196: Late-News Poster: Off Current Reduction of BG poly-Si TFT by PLAS Process", SID Symposium Digest of Technical Papers, vol. 49, Issue 1, pp. 1284-1287.

N. Nodera et al., "Novel LTPS technology for large substrate", Journal of the Society for Information Display, vol. 24, Issue 6, pp. 394-401.

* cited by examiner

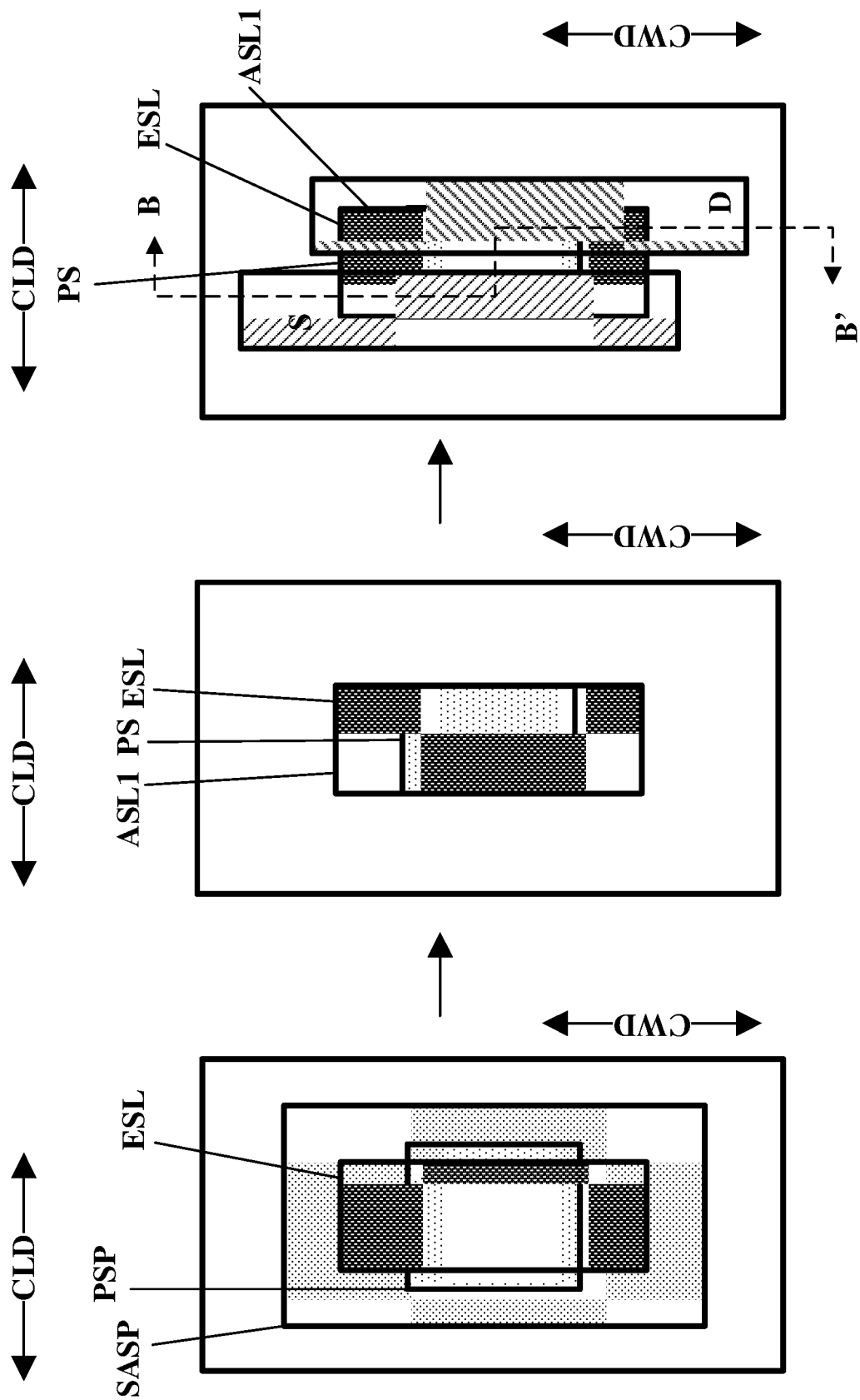

THIN FILM TRANSISTOR, DISPLAY APPARATUS, AND METHOD OF FABRICATING THIN FILM TRANSISTOR

CROSS-REFERENCE TO RELATED APPLICATION

This application is a national stage application under 35 U.S.C. § 371 of International Application No. PCT/CN2020/137869, filed Dec. 21, 2020, the contents of which are incorporated by reference in the entirety.

TECHNICAL FIELD

The present invention relates to display technology, more particularly, to a thin film transistor, a display apparatus, and a method of fabricating a thin film transistor.

BACKGROUND

Display devices such as liquid crystal display (LCD) and organic light-emitting diode (OLED) have been widely used. LCD and OLED display devices use thin film transistor (TFT) to control pixels in the display panel. Examples of TFT include amorphous silicon TFT, polycrystalline silicon TFT, single crystal silicon TFT, and metal oxide TFT. Polysilicon has a higher mobility rate and stability than amorphous silicon. Low temperature polycrystalline silicon (LTPS) thin film transistors have found a wide range of applications in display field. In conventional LTPS thin film transistors, the channel region is doped with a first dopant of a first type, and the source electrode and drain electrode contact region is doped with a second dopant of a second type. The first dopant and the second dopant are different types of dopants selected form a p-type dopant and an n-type dopant.

SUMMARY

In one aspect, the present disclosure provides a thin film transistor, comprising a base substrate; a gate electrode on the base substrate; an active layer on the base substrate, the active layer comprising a polycrystalline silicon part comprising a polycrystalline silicon material and an amorphous silicon part comprising an amorphous silicon material; a gate insulating layer insulating the gate electrode from the active layer; a source electrode and a drain electrode on the base substrate; and an etch stop layer on a side of the polycrystalline silicon part away from the base substrate; wherein an orthographic projection of the etch stop layer on the base substrate covers an orthographic projection of the polycrystalline silicon part on the base substrate, and an orthographic projection of at least a portion of the amorphous silicon part on the base substrate.

Optionally, the orthographic projection of the etch stop layer on the base substrate covers orthographic projections of a first portion and a second portion of the amorphous silicon part on the base substrate; the first portion and the second portion are respectively on two opposite sides of the polycrystalline silicon part; and the first portion, the second portion, and the polycrystalline silicon part are in a same layer, are in direct contact with the etch stop layer, and are on a side of the etch stop layer closer to the base substrate.

Optionally, the amorphous silicon part comprises a first amorphous silicon layer and a second amorphous silicon layer; the first amorphous silicon layer is in a same layer as the polycrystalline silicon part, and comprising the first portion and the second portion; and the second amorphous silicon layer is on a side of the etch stop layer away from the base substrate.

Optionally, the second amorphous silicon layer comprises a third portion and a fourth portion; the third portion is in direct contact with the first portion; the fourth portion is in direct contact with the second portion; and the first portion, the second portion, the third portion, the fourth portion, and the polycrystalline silicon part are in direct contact with the gate insulating layer.

Optionally, the first amorphous silicon layer consists of the first portion and the second portion; the first portion, the polycrystalline silicon part, and the second portion are sequentially arranged along a channel width direction; along a channel length direction, each of the polycrystalline silicon part, the first portion, and the second portion has a dimension substantially same as a dimension of the etch stop layer; along the channel width direction, a combination of the polycrystalline silicon part, the first portion, and the second portion has a dimension substantially same as a dimension of the etch stop layer; and the orthographic projection of the etch stop layer on the base substrate substantially overlaps with an orthographic projection of the combination of the polycrystalline silicon part, the first portion, and the second portion on the base substrate.

Optionally, the first amorphous silicon layer further comprising a fifth portion and a sixth portion; the fifth portion is in direct contact with the first portion; the sixth portion is in direct contact with the second portion; the first portion, the second portion, the fifth portion, the sixth portion, and the polycrystalline silicon part are in direct contact with the gate insulating layer; and the second amorphous silicon layer is in direct contact with the fifth portion, and in direct contact with the sixth portion.

Optionally, the second amorphous silicon layer comprises a seventh portion and an eighth portion; the seventh portion is on a side of the etch stop layer away from the first portion; the eighth portion is on a side of the etch stop layer away from the second portion; an orthographic projection of the seventh portion on the base substrate at least partially overlaps with an orthographic projection of the first portion on the base substrate; and an orthographic projection of the eighth portion on the base substrate at least partially overlaps with an orthographic projection of the second portion on the base substrate.

Optionally, the thin film transistor further comprises a doped amorphous silicon layer on a side of the etch stop layer away from the base substrate; wherein the doped amorphous silicon layer is between the source electrode and the second amorphous silicon layer, and between the drain electrode and the second amorphous silicon layer.

Optionally, the amorphous silicon part consists of a first amorphous silicon layer; the first amorphous silicon layer is in a same layer as the polycrystalline silicon part, and comprising the first portion, the second portion, a fifth portion, and a sixth portion; the fifth portion is in direct contact with the first portion; the sixth portion is in direct contact with the second portion; and the first portion, the second portion, the fifth portion, the sixth portion, and the polycrystalline silicon part are in direct contact with the gate insulating layer.

Optionally, the thin film transistor further comprises a doped amorphous silicon layer on a side of the etch stop layer away from the base substrate; wherein the doped amorphous silicon layer is between the source electrode and the first amorphous silicon layer, and between the drain electrode and the first amorphous silicon layer.

Optionally, the amorphous silicon part is on a side of the polycrystalline silicon part away from the base substrate; the etch stop layer is on a side of the amorphous silicon part away from the polycrystalline silicon part; and the amorphous silicon part spaces apart the etch stop layer from the polycrystalline silicon part.

Optionally, the thin film transistor further comprises a doped amorphous silicon layer on a side of the etch stop layer away from the base substrate; wherein the doped amorphous silicon layer is between the source electrode and the amorphous silicon part, between the source electrode and the polycrystalline silicon part, between the drain electrode and the amorphous silicon part, and between the drain electrode and the polycrystalline silicon part; and the doped amorphous silicon layer is in direct contact with the amorphous silicon part, and is in direct contact with the polycrystalline silicon part.

In another aspect, the present disclosure provides a display apparatus, comprising a display substrate comprising a thin film transistor described herein or fabricated by a method described herein, and one or more integrated circuits connected to the display substrate.

In another aspect, the present disclosure provides a method of fabricating a thin film transistor, comprising forming a gate electrode on a base substrate; forming an active layer on the base substrate, forming the active layer comprising forming a polycrystalline silicon part comprising a polycrystalline silicon material and forming an amorphous silicon part comprising an amorphous silicon material; forming a gate insulating layer, the gate insulating layer formed to insulate the gate electrode from the active layer; forming a source electrode and a drain electrode on the base substrate; and forming an etch stop layer on a side of the polycrystalline silicon part away from the base substrate; wherein an orthographic projection of the etch stop layer on the base substrate covers an orthographic projection of the polycrystalline silicon part on the base substrate, and an orthographic projection of at least a portion of the amorphous silicon part on the base substrate.

Optionally, forming the active layer comprises depositing a first amorphous silicon material layer on the base substrate; and crystallizing a part of the first amorphous silicon material layer into the polycrystalline silicon material, thereby forming the polycrystalline silicon part; wherein the orthographic projection of the etch stop layer on the base substrate covers orthographic projections of the polycrystalline silicon part, and a first portion and a second portion of the first amorphous silicon material layer, on the base substrate; the first portion and the second portion are respectively on two opposite sides of the polycrystalline silicon part; and the first portion, the second portion, and the polycrystalline silicon part are in a same layer, are in direct contact with the etch stop layer, and are on a side of the etch stop layer closer to the base substrate.

Optionally, subsequent to forming the etch stop layer, further comprising forming a second amorphous silicon material layer on a side of the etch stop layer away from the base substrate; and patterning the second amorphous silicon material layer to form a second amorphous silicon layer.

Optionally, subsequent to crystallizing the part of the first amorphous silicon material layer and forming the etch stop layer, the method further comprises patterning the first amorphous silicon material layer to remove portions uncovered by the etch stop layer, thereby forming a first amorphous silicon layer comprising the first portion and the second portion; wherein the second amorphous silicon layer is formed to comprise a third portion and a fourth portion; the third portion is formed to be in direct contact with the first portion; the fourth portion is formed to be in direct contact with the second portion; and the first portion, the second portion, the third portion, the fourth portion, and the polycrystalline silicon part are formed to be in direct contact with the gate insulating layer.

Optionally, patterning the first amorphous silicon material layer forms the first amorphous silicon layer consisting of the first portion and the second portion; the first portion, the polycrystalline silicon part, and the second portion are formed to be sequentially arranged along a channel width direction; along a channel length direction, each of the polycrystalline silicon part, the first portion, and the second portion has a dimension substantially same as a dimension of the etch stop layer; along the channel width direction, a combination of the polycrystalline silicon part, the first portion, and the second portion has a dimension substantially same as a dimension of the etch stop layer; and the orthographic projection of the etch stop layer on the base substrate substantially overlaps with an orthographic projection of the combination of the polycrystalline silicon part, the first portion, and the second portion on the base substrate.

Optionally, subsequent to crystallizing the part of the first amorphous silicon material layer, the method further comprises patterning the first amorphous silicon material layer to form a first amorphous silicon layer comprising the first portion, the second portion, a fifth portion, and a sixth portion; wherein the fifth portion is formed to be in direct contact with the first portion; the sixth portion is formed to be in direct contact with the second portion; the first portion, the second portion, the fifth portion, the sixth portion, and the polycrystalline silicon part are formed to be in direct contact with the gate insulating layer; and the second amorphous silicon layer is formed to be in direct contact with the fifth portion, and in direct contact with the sixth portion.

Optionally, the method further comprises forming a doped amorphous silicon layer on a side of the etch stop layer away from the base substrate; wherein the doped amorphous silicon layer is formed between the source electrode and the second amorphous silicon layer, and between the drain electrode and the second amorphous silicon layer.

Optionally, subsequent to crystallizing the part of the first amorphous silicon material layer, the method further comprises patterning the first amorphous silicon material layer to form a first amorphous silicon layer comprising the first portion, the second portion, a fifth portion, and a sixth portion; wherein the fifth portion is formed to be in direct contact with the first portion; the sixth portion is formed to be in direct contact with the second portion; and the first portion, the second portion, the fifth portion, the sixth portion, and the polycrystalline silicon part are formed to be in direct contact with the gate insulating layer; the method further comprises forming a doped amorphous silicon layer on a side of the etch stop layer and the first amorphous silicon layer away from the base substrate; wherein the doped amorphous silicon layer is formed between the source electrode and the fifth portion, and between the drain electrode and the sixth portion.

Optionally, forming the active layer comprises depositing a first amorphous silicon material layer on the base substrate; crystallizing a part of the first amorphous silicon material layer into the polycrystalline silicon material; depositing a second amorphous silicon material layer on a side of the first amorphous silicon material layer away from the base substrate; forming an etch stop layer on a side of the second amorphous silicon material layer away from the part of the first amorphous silicon material layer that is crystallized; and patterning the first amorphous silicon material layer and the second amorphous silicon material layer using the etch stop layer as a mask plate, thereby forming the polycrystalline silicon part and the amorphous silicon part; wherein the amorphous silicon part is formed on a side of the polycrystalline silicon part away from the base substrate; the etch stop layer is formed on a side of the amorphous silicon part away from the polycrystalline silicon part; and the amorphous silicon part spaces apart the etch stop layer from the polycrystalline silicon part.

Optionally, the method further comprises forming a doped amorphous silicon layer on a side of the etch stop layer away from the base substrate; wherein the doped amorphous silicon layer is formed between the source electrode and the amorphous silicon part, between the source electrode and the polycrystalline silicon part, between the drain electrode and the amorphous silicon part, and between the drain electrode and the polycrystalline silicon part; and the doped amorphous silicon layer is formed in direct contact with the amorphous silicon part, and is in direct contact with the polycrystalline silicon part.

BRIEF DESCRIPTION OF THE FIGURES

The following drawings are merely examples for illustrative purposes according to various disclosed embodiments and are not intended to limit the scope of the present invention.

FIG. 6A to 6C illustrate a method of fabricating a thin film transistor in plan view in some embodiments according to the present disclosure.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, a thin film transistor, a display apparatus, and a method of fabricating a thin film transistor that substantially obviate one or more of the problems due to limitations and disadvantages of the related art. In one aspect, the present disclosure provides a thin film transistor. In some embodiments, the thin film transistor includes a base substrate; a gate electrode on the base substrate; an active layer on the base substrate, the active layer comprising a polycrystalline silicon part comprising a polycrystalline silicon material and an amorphous silicon part comprising an amorphous silicon material; a gate insulating layer insulating the gate electrode from the active layer; a source electrode and a drain electrode on the base substrate; and an etch stop layer on a side of the polycrystalline silicon part away from the base substrate. Optionally, an orthographic projection of the etch stop layer on the base substrate covers an orthographic projection of the polycrystalline silicon part on the base substrate, and an orthographic projection of at least a portion of the amorphous silicon part on the base substrate.

Figure 1:
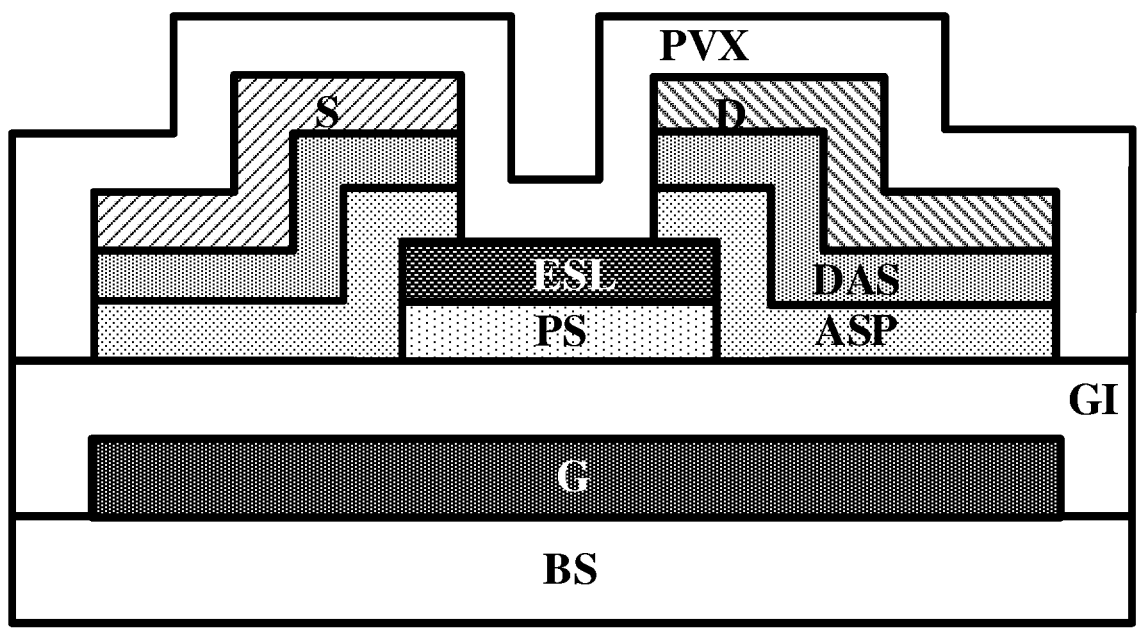
FIG. 1 is a schematic diagram illustrating the structure of a thin film transistor in some embodiments according to the present disclosure.

FIG. 1 is a schematic diagram illustrating the structure of a thin film transistor in some embodiments according to the present disclosure. Referring to FIG. 1, the thin film transistor in some embodiments includes a base substrate BS; a gate electrode G on the base substrate BS; a gate insulating layer GI on a side of the gate electrode G away from the base substrate BS; an active layer on a side of the gate insulating layer GI away from the base substrate BS, the active layer including a polycrystalline silicon part PS having a polycrystalline silicon material and an amorphous silicon part ASP having an amorphous silicon material; a source electrode S and a drain electrode D on a side of the active layer away from the base substrate BS; and an etch stop layer ESL on a side of the polycrystalline silicon part PS away from the base substrate BS. FIG. 1 shows a bottom gate thin film transistor. The thin film transistor according to the present disclosure may be of any appropriate type of thin film transistors, includes a top gate thin film transistor and a bottom gate thin film transistor.

In some embodiments, the thin film transistor further includes an ohmic contact layer between the source electrode S and the active layer, and between the drain electrode D and the active layer. Metal materials and semiconductor materials have different work functions. At an interface between a metal material and a semiconductor material in a thin film transistor, electrons flow from a material having a lower work function to another material having a higher work function, until two Femi levels of two materials equilibrate to a same level through the local exchange of carriers. At the equilibration point, either an ohmic contact or a Schottky contact is formed at the interface. Schottky contact resistance limits frequency response of an apparatus. Charging and discharging of Schottky contact resistance result in additional energy consumption. In contrast, ohmic contact does not produce significant additional impedance, and does not change the balanced carrier concentration in the active layer in any significant manner. Thus, the ohmic contact is the ideal contact type in a thin film transistor.

In some embodiments, the present thin film transistor uses a doped amorphous silicon layer as the ohmic contact layer. Referring to FIG. 1, the thin film transistor in some embodiments further includes a doped amorphous silicon layer DAS on a side of the etch stop layer ESL away from the base substrate BS. Optionally, the doped amorphous silicon layer is a heavily doped amorphous silicon layer. By using a doped amorphous silicon layer as the ohmic contact layer, the present thin film transistor obviates complicated ion implantation processes yet achieves excellent ohmic contact.

Various appropriate dopants may be used for forming the ohmic contact layer such as the doped amorphous silicon layer DAS. In some embodiments, the dopant is a P-type dopant such as a Group IIIA element of the Periodic Table of the Elements including boron (B), aluminum (Al), gallium (Ga), indium (In), and thallium (Tl). In some embodiments, the dopant is an N-type dopant such as a Group VA element of the Periodic Table of the Elements including nitrogen (N), phosphorous (P), arsenic (As), antimony (Sb), and bismuth (Bi). Various appropriate doping concentrations may be used for forming the first dopant layer. In one example, the doping concentration is in the range of about $1\times10^{11}$ atom/cm$^3$ to $1\times10^{13}$ atom/cm$^3$, e.g., about $1\times10^{11}$ atom/cm$^3$ to $1\times10^{12}$ atom/cm$^3$ or about $1\times10^{12}$ atom/cm$^3$ to $1\times10^{13}$ atom/cm$^3$.

In some embodiments, an orthographic projection of the etch stop layer ESL on the base substrate BS covers an orthographic projection of the polycrystalline silicon part PS on the base substrate BS, as shown in FIG. 1. The portion of the active layer covered by the etch stop layer ESL may be considered as a channel part of the active layer. The amorphous silicon part ASP may be considered as a source electrode contact part (left side of the amorphous silicon part ASP in FIG. 1) and a drain electrode contact part (right side of the amorphous silicon part ASP in FIG. 1). As used herein, the term "source electrode contact part" refers to a part of the active layer in contact with the source electrode. As used herein, the term "drain electrode contact part" refers to a part of the active layer in contact with the drain electrode. As used herein, the term "channel part" refers to a part of the active layer between the source electrode contact part and the drain electrode contact part. The channel part allows electrical communication between the source electrode and the drain electrode.

Figures 2A, 2B, 2C:
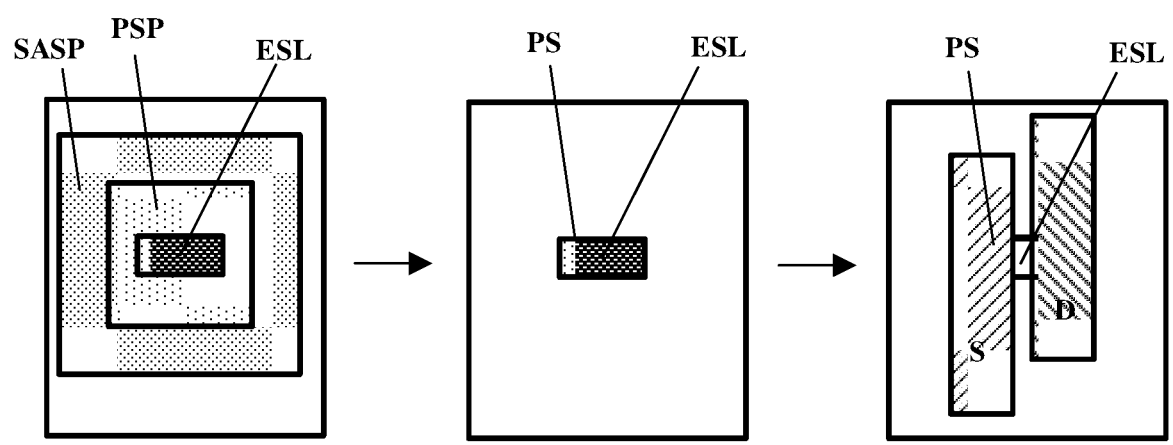
FIG. 2A to 2C illustrate a method of fabricating a thin film transistor in some embodiments according to the present disclosure.

FIG. 2A to 2C illustrate a method of fabricating a thin film transistor in some embodiments according to the present disclosure. As shown in FIG. 2A, an amorphous silicon material is formed on a base substrate, a portion of which is crystallized to form the polycrystalline silicon material portion PSP. An etch stop layer ESL is formed on the polycrystalline silicon material portion PSP. The etch stop layer ESL is smaller than the polycrystalline silicon material portion PSP, e.g., an orthographic projection of the polycrystalline silicon material portion PSP on the base substrate covers an orthographic projection of the etch stop layer ESL. The polycrystalline silicon material portion PSP and a surrounding amorphous silicon material portion SASP are patterned (e.g., etched) using the etch stop layer ESL as a mask plate. Referring to FIG. 2B and FIG. 1, a polycrystalline silicon part PS is formed as a result of the patterning. An orthographic projection of the etch stop layer ESL on the base substrate substantially overlaps with an orthographic projection of the polycrystalline silicon part PS on the base substrate, the etch stop layer ESL and the polycrystalline silicon part PS have a substantially same dimension. As used herein, the term "substantially the same" refers to a difference between two values not exceeding 10% of a base value (e.g., one of the two values), e.g., not exceeding 8%, not exceeding 6%, not exceeding 4%, not exceeding 2%, not exceeding 1%, not exceeding 0.5%, not exceeding 0.1%, not exceeding 0.05%, and not exceeding 0.01%, of the base value. Referring to FIG. 2C, subsequent to forming the polycrystalline silicon part PS, a second amorphous silicon layer, an ohmic contact layer, a source electrode S, and a drain electrode D are formed.

The inventors of the present disclosure discover that, surprisingly and unexpectedly, a leak current of the thin film transistor can be significantly lowered by forming a channel part of the active layer to include a polycrystalline silicon part and at least a portion of an amorphous silicon part. Moreover, properties such as migration rate of the thin film transistor can also be improved by the present thin film transistor.

Figure 3A:
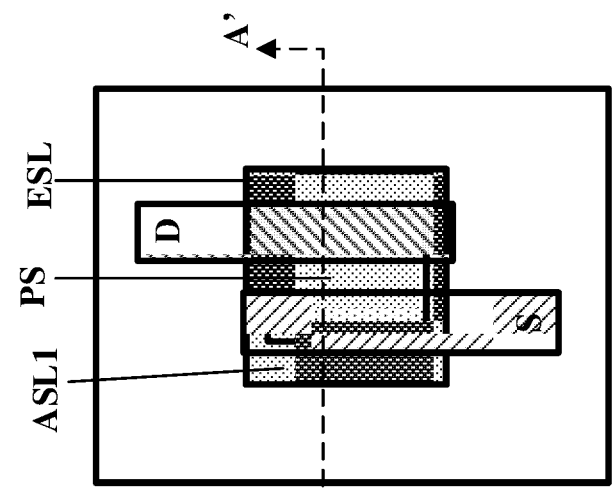
FIG. 3A to 3C illustrate a method of fabricating a thin film transistor in plan view in some embodiments according to the present disclosure.
Figure 3B:
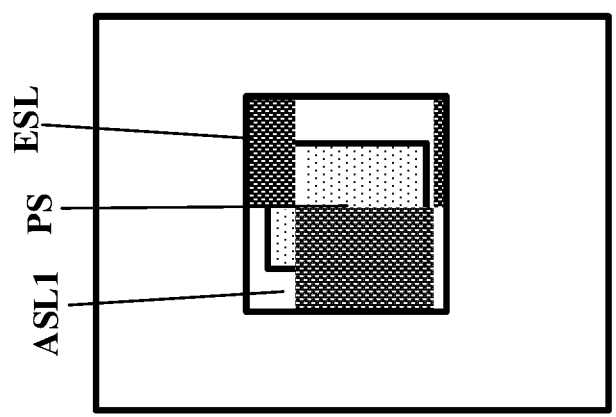
Figure 3C:
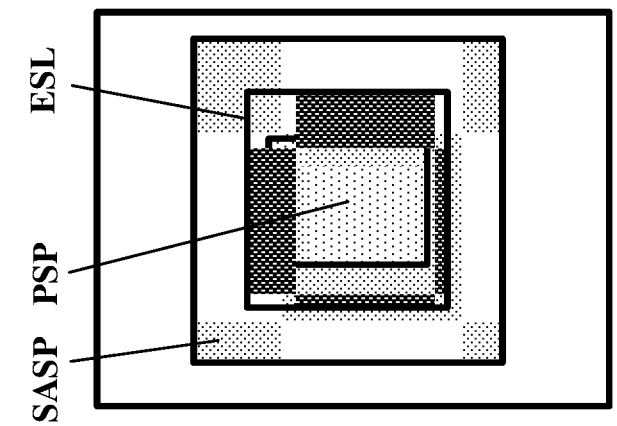
Figure 4A:
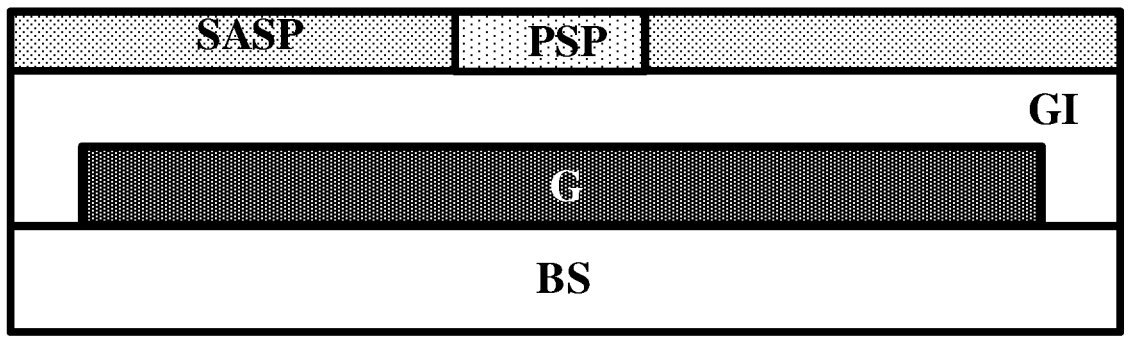
FIG. 4A to 4C illustrate a method of fabricating a thin film transistor in cross-sectional view in some embodiments according to the present disclosure.
Figure 4B:
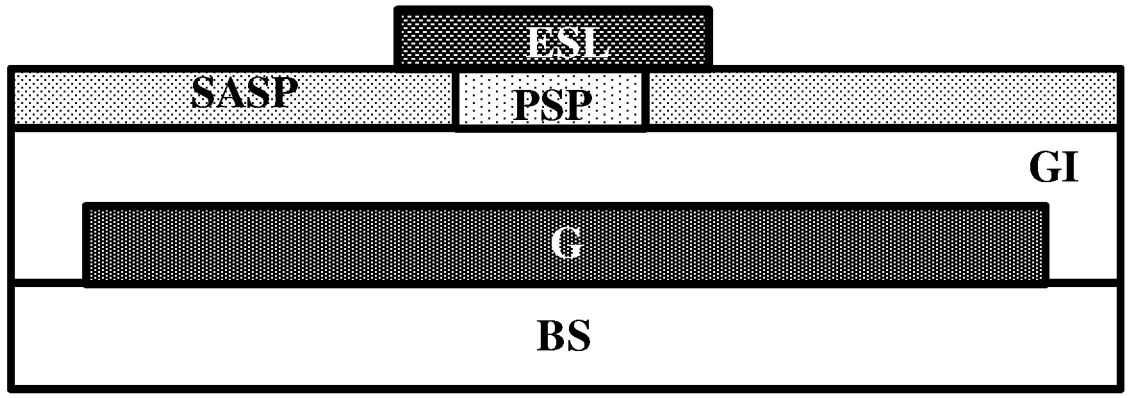
Figure 4C:
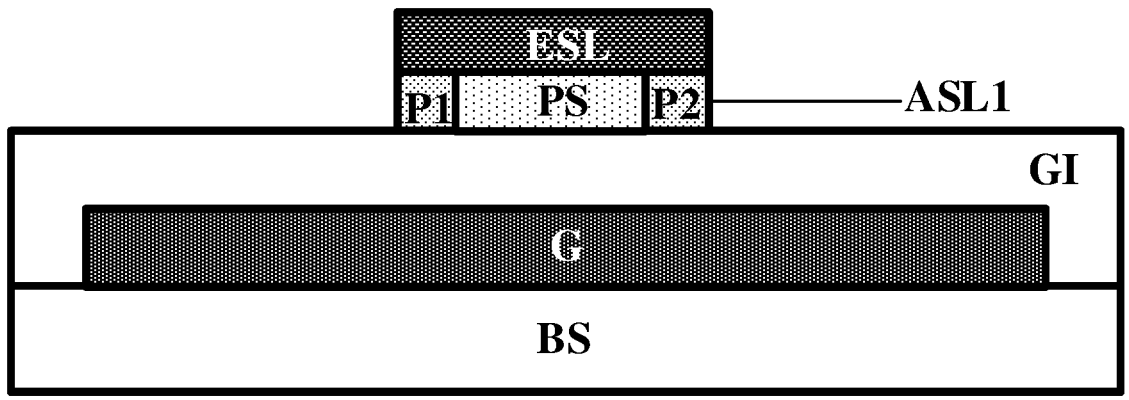

FIG. 3A to 3C illustrate a method of fabricating a thin film transistor in plan view in some embodiments according to the present disclosure. FIG. 4A to 4C illustrate a method of fabricating a thin film transistor in cross-sectional view in some embodiments according to the present disclosure. As shown in FIG. 3A and FIG. 4A, an amorphous silicon material is formed on a base substrate, a portion of which is crystallized to form the polycrystalline silicon material portion PSP. Referring to FIG. 3A and FIG. 4B, an etch stop layer ESL is formed on the polycrystalline silicon material portion PSP. The etch stop layer ESL is larger than the polycrystalline silicon material portion PSP, e.g., an orthographic projection of the etch stop layer ESL on the base substrate BS covers an orthographic projection of the polycrystalline silicon material portion PSP. The polycrystalline silicon material portion PSP and a surrounding amorphous silicon material portion SASP are patterned (e.g., etched) using the etch stop layer ESL as a mask plate. Referring to FIG. 3B and FIG. 4C, a polycrystalline silicon part PS is formed as a result of the patterning. An orthographic projection of the etch stop layer ESL on the base substrate BS substantially covers an orthographic projection of the polycrystalline silicon part PS on the base substrate BS. The surrounding amorphous silicon material portion SASP are patterned to form a first amorphous silicon layer ASL1 comprising at least a first portion P1 and a second portion P2. A combination of the polycrystalline silicon part PS and the first amorphous silicon layer ASL1 has a substantially same dimension as the etch stop layer ESL. Referring to FIG. 3C, subsequent to forming the polycrystalline silicon part PS, a second amorphous silicon layer, an ohmic contact layer, a source electrode S. and a drain electrode D are formed.

Figure 5A:
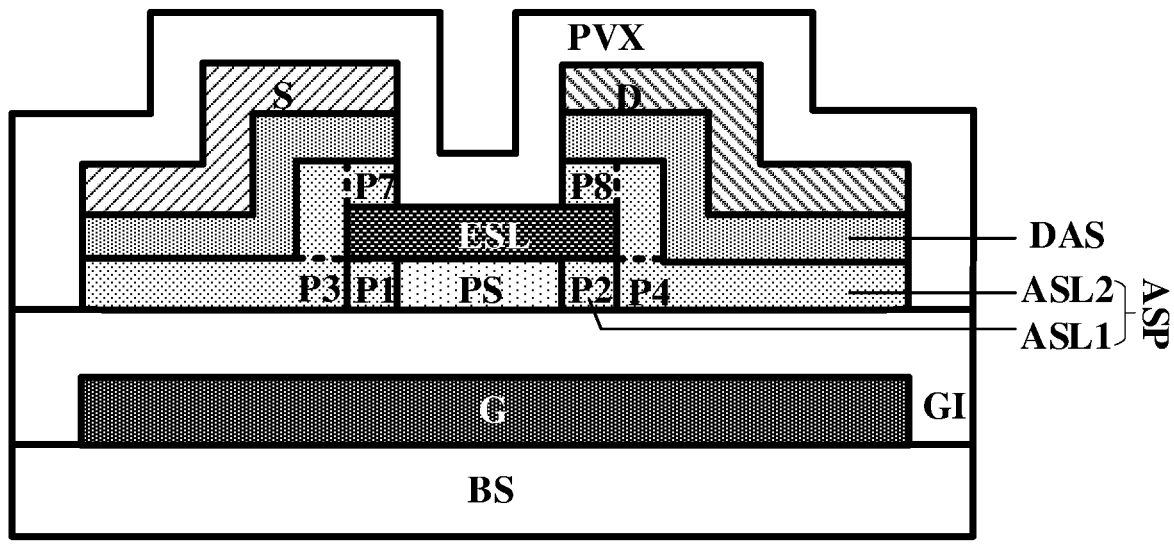
FIG. 5A is cross-sectional view along an A-A' line in FIG. 3C.
Figure 5B:
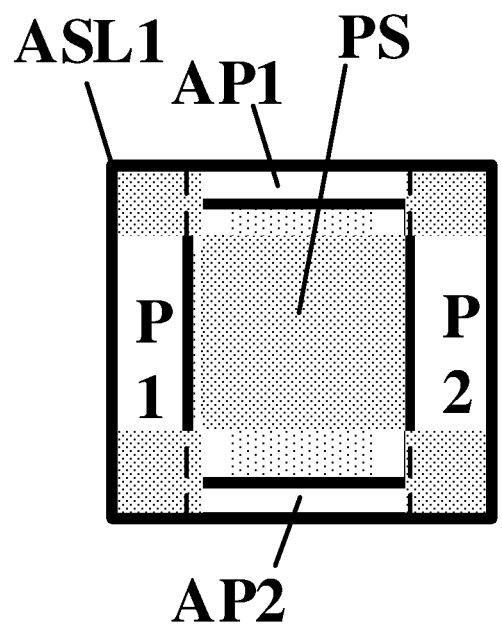
FIG. 5B is a plan view of a polycrystalline silicon part and a first amorphous silicon layer in some embodiments according to the present disclosure.

FIG. 5A is cross-sectional view along an A-A' line in FIG. 3C. FIG. 5B is a plan view of a polycrystalline silicon part and a first amorphous silicon layer in some embodiments according to the present disclosure. Referring to FIG. 5A and FIG. 5B, the thin film transistor in some embodiments includes a base substrate BS; a gate electrode G on the base substrate BS; a gate insulating layer GI on a side of the gate electrode G away from the base substrate BS; an active layer on a side of the gate insulating layer GI away from the base substrate BS, the active layer including a polycrystalline silicon part PS having a polycrystalline silicon material and an amorphous silicon part ASP having an amorphous silicon material; a source electrode S and a drain electrode D on a side of the active layer away from the base substrate BS; and an etch stop layer ESL on a side of the polycrystalline silicon part PS away from the base substrate BS. FIG. 5A shows a bottom gate thin film transistor. The thin film transistor according to the present disclosure may be of any appropriate type of thin film transistors, includes a top gate thin film transistor and a bottom gate thin film transistor.

In some embodiments, an orthographic projection of the etch stop layer ESL on the base substrate BS covers an orthographic projection of the polycrystalline silicon part PS on the base substrate BS, and an orthographic projection of at least a portion of the amorphous silicon part ASP on the base substrate BS. The portion of the active layer covered by the etch stop layer ESL may be considered as a channel part of the active layer. Referring to FIG. 5A, FIG. 5B, and FIG. 3C, the channel part of the active layer in one example includes the polycrystalline silicon part PS, a first portion P1 and a second portion P2 of the amorphous silicon part ASP. The orthographic projection of the etch stop layer ESL on the base substrate BS covers orthographic projections of a first portion P1 and a second portion P2 of the amorphous silicon part on the base substrate BS, and covers the orthographic projection of the polycrystalline silicon part PS on the base substrate BS. The first portion P1 and the second portion P2 are respectively on two opposite sides of the polycrystalline silicon part PS. The first portion P1, the second portion P2, and the polycrystalline silicon part PS are in a same layer, are in direct contact with the etch stop layer ESL, and are on a side of the etch stop layer ESL closer to the base substrate BS.

In some embodiments, the amorphous silicon part ASP includes a first amorphous silicon layer ASL1 and a second amorphous silicon layer ASL2. The first amorphous silicon layer ASL1 is in a same layer as the polycrystalline silicon part PS, and includes the first portion P1 and the second portion P2. The second amorphous silicon layer ASL2 is on a side of the etch stop layer ESL away from the base substrate BS. As used herein, the term "same layer" refers to the relationship between the layers simultaneously formed in the same step. In one example, the first amorphous silicon layer ASL1 and the polycrystalline silicon part PS are in a same layer when they are formed as a result of one or more steps of a same patterning process performed in a material deposited in a same deposition process. In another example, the first amorphous silicon layer ASL1 and the polycrystalline silicon part PS can be formed in a same layer by simultaneously performing the step of forming the first amorphous silicon layer ASL1 and the step of forming the polycrystalline silicon part PS. The term "same layer" does not always mean that the thickness of the layer or the height of the layer in a cross-sectional view is the same.

Referring to FIG. 5A and FIG. 5B, the first amorphous silicon layer ASL1 in some embodiments includes the first portion P1, the second portion P2, a first additional portion AP1, and a second additional portion AP2. The combination of the first portion P1, the second portion P2, the first additional portion AP1, and the second additional portion AP2 surrounds the polycrystalline silicon part PS.

In some embodiments, the second amorphous silicon layer ASL2 includes a third portion P3 and a fourth portion P4. The third portion P3 is in direct contact with the first portion P1. The fourth portion P4 is in direct contact with the second portion P2. Optionally, the first portion P1, the second portion P2, the third portion P3, the fourth portion P4, and the polycrystalline silicon part PS are in direct contact with the gate insulating layer GI. Optionally, each of the first portion P1, the second portion P2, the first additional portion AP1, the second additional portion AP2, and the polycrystalline silicon part PS is on a surface of a same layer, e.g., on a surface of the gate insulating layer GI.

Figure 7A:
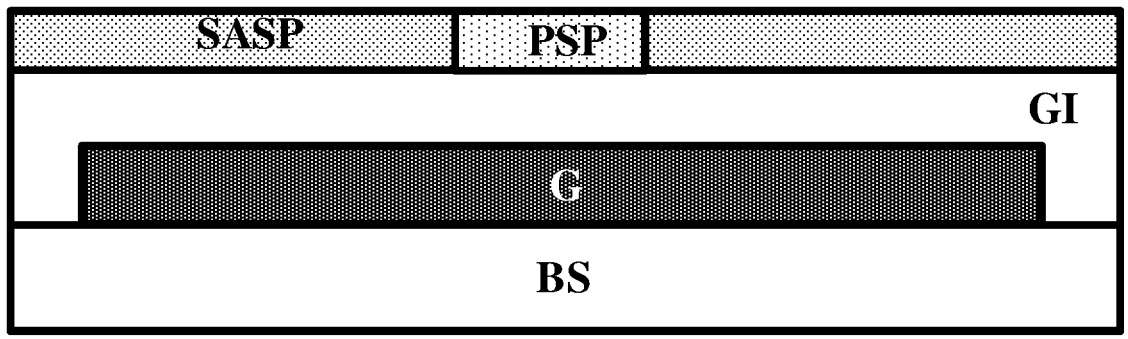
FIG. 7A to 7C illustrate a method of fabricating a thin film transistor in cross-sectional view in some embodiments according to the present disclosure.
Figure 7B:
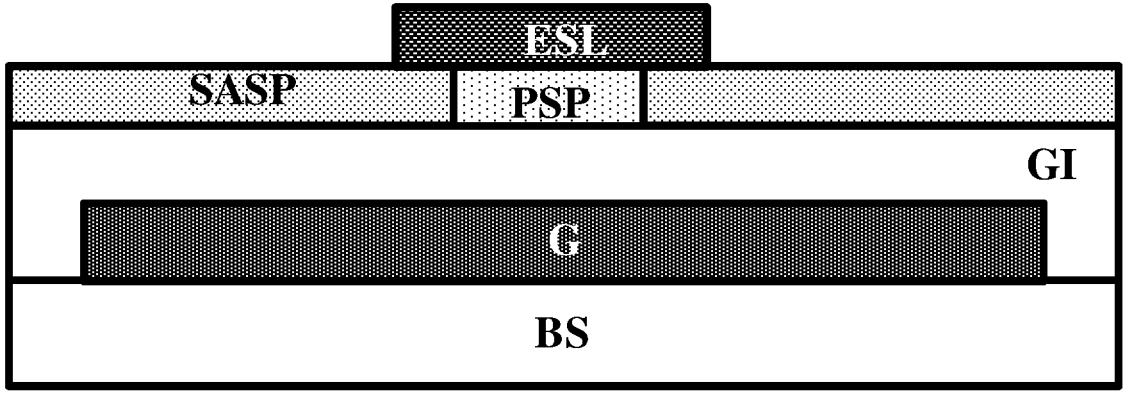
Figure 7C:
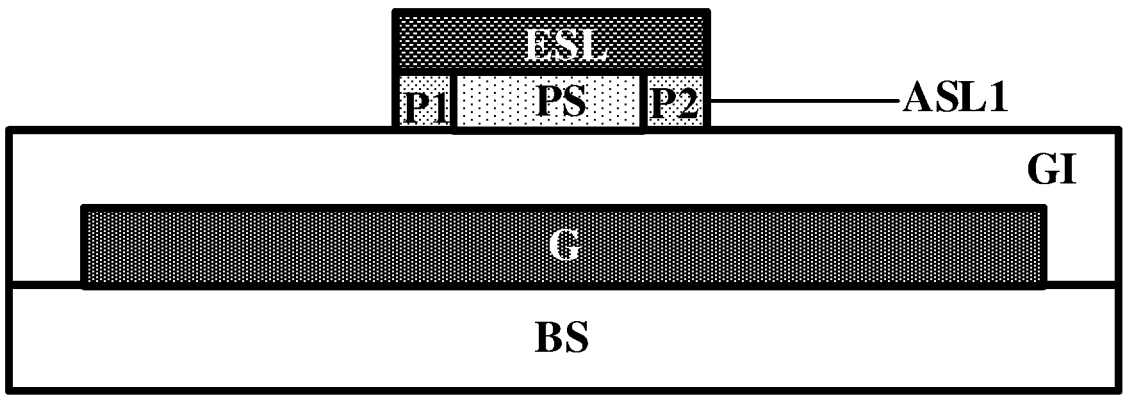

FIG. 6A to 6C illustrate a method of fabricating a thin film transistor in plan view in some embodiments according to the present disclosure. FIG. 7A to 7C illustrate a method of fabricating a thin film transistor in cross-sectional view in some embodiments according to the present disclosure. As shown in FIG. 6A and FIG. 7A, an amorphous silicon material is formed on a base substrate, a portion of which is crystallized to form the polycrystalline silicon material portion PSP. Referring to FIG. 6A and FIG. 7B, an etch stop layer ESL is formed on the polycrystalline silicon material portion PSP. The etch stop layer ESL is larger than the polycrystalline silicon material portion PSP, e.g., an orthographic projection of the etch stop layer ESL on the base substrate BS covers an orthographic projection of the polycrystalline silicon material portion PSP. The polycrystalline silicon material portion PSP and a surrounding amorphous silicon material portion SASP are patterned (e.g., etched) using the etch stop layer ESL as a mask plate. Referring to FIG. 6B and FIG. 7C, a polycrystalline silicon part PS is formed as a result of the patterning. An orthographic projection of the etch stop layer ESL on the base substrate BS substantially covers an orthographic projection of the polycrystalline silicon part PS on the base substrate BS. The surrounding amorphous silicon material portion SASP are patterned to form a first amorphous silicon layer ASL1 consisting of a first portion P1 and a second portion P2. A combination of the polycrystalline silicon part PS and the first amorphous silicon layer ASL1 has a substantially same dimension as the etch stop layer ESL. Referring to FIG. 6C, subsequent to forming the polycrystalline silicon part PS, a second amorphous silicon layer, an ohmic contact layer, a source electrode S, and a drain electrode D are formed.

Referring to FIG. 6A, along a channel length direction CLD, the etch stop layer ESL has a dimension smaller than a dimension of the polycrystalline silicon material portion PSP. Along a channel width direction CWD, the etch stop layer ESL has a dimension greater than a dimension of the polycrystalline silicon material portion PSP. Optionally, along the channel length direction CLD, the polycrystalline silicon material portion PSP has a dimension greater than the dimension of the etch stop layer ESL by a margin in a range of 0.5 µm to 5.0 µm, e.g., 0.5 µm to 1.0 µm, 1.0 µm to 2.0 µm, 2.0 µm to 3.0 µm, 3.0 µm to 4.0 µm, or 4.0 µm to 5.0 µm. Optionally, along the channel width direction CWD, the etch stop layer ESL has a dimension greater than the dimension of the polycrystalline silicon material portion PSP by a margin in a range of 0.5 µm to 5.0 µm, e.g., 0.5 µm to 1.0 µm, 1.0 µm to 2.0 µm, 2.0 µm to 3.0 µm, 3.0 µm to 4.0 µm, or 4.0 µm to 5.0 µm.

Referring to FIG. 6B, subsequent to etching, along a channel length direction CLD, the etch stop layer ESL has a dimension substantially same as a dimension of the polycrystalline silicon part PS. Subsequent to etching, along a channel width direction CWD, the etch stop layer ESL has a dimension greater than a dimension of the polycrystalline silicon material portion PSP. Optionally, along the channel width direction CWD, the etch stop layer ESL has a dimension greater than the dimension of the polycrystalline silicon material portion PSP by a margin in a range of 0.5 µm to 5.0 µm, e.g., 0.5 µm to 1.0 µm, 1.0 µm to 2.0 µm, 2.0 µm to 3.0 µm, 3.0 µm to 4.0 µm, or 4.0 µm to 5.0 µm.

Figure 8A:
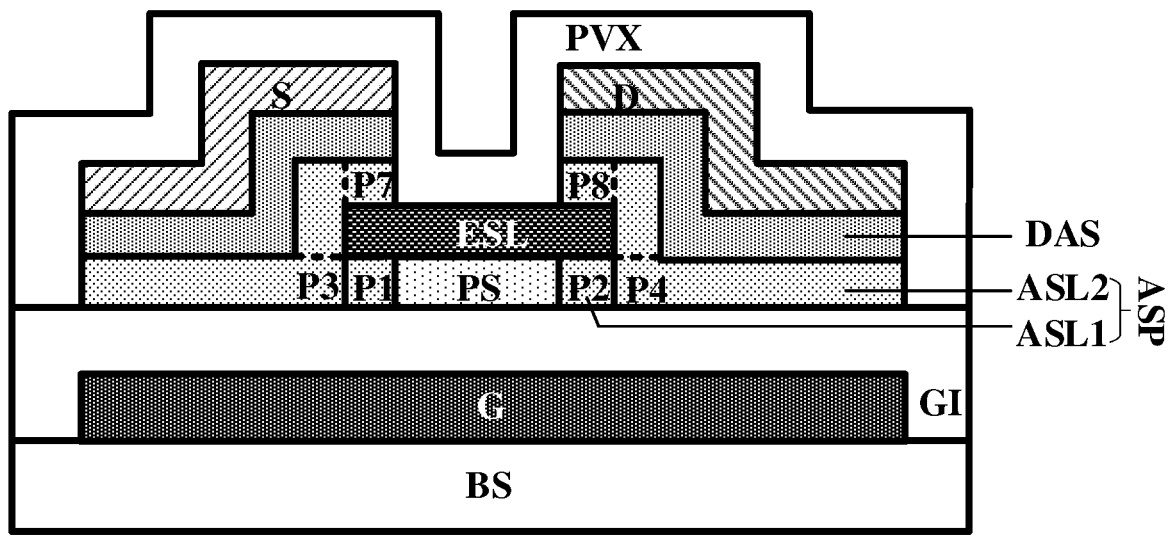
FIG. 8A is cross-sectional view along a B-B' line in FIG. 6C.
Figure 8B:
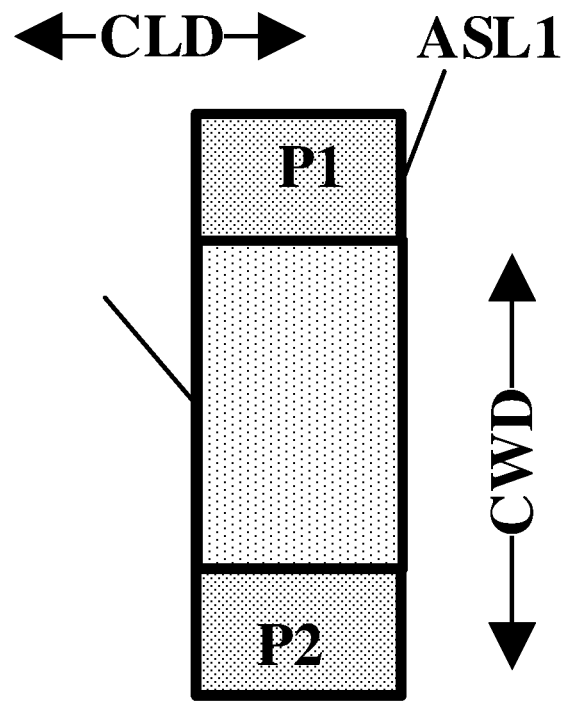
FIG. 8B is a plan view of a polycrystalline silicon part and a first amorphous silicon layer in some embodiments according to the present disclosure.

The inventors of the present disclosure discover that, surprisingly and unexpectedly, not only a leak current of the thin film transistor can be significantly lowered by forming the active layer according to the present disclosure, but properties such as migration rate of the thin film transistor can also be significantly improved. FIG. 8A is cross-sectional view along a B-B' line in FIG. 6C. FIG. 8B is a plan view of a polycrystalline silicon part and a first amorphous silicon layer in some embodiments according to the present disclosure. Referring to FIG. 8A and FIG. 8B, the thin film transistor in some embodiments includes a base substrate BS; a gate electrode G on the base substrate BS; a gate insulating layer GI on a side of the gate electrode G away from the base substrate BS; an active layer on a side of the gate insulating layer GI away from the base substrate BS, the active layer including a polycrystalline silicon part PS having a polycrystalline silicon material and an amorphous silicon part ASP having an amorphous silicon material; a source electrode S and a drain electrode D on a side of the active layer away from the base substrate BS; and an etch stop layer ESL on a side of the polycrystalline silicon part PS away from the base substrate BS. FIG. 8A shows a bottom gate thin film transistor. The thin film transistor according to the present disclosure may be of any appropriate type of thin film transistors, includes a top gate thin film transistor and a bottom gate thin film transistor.

In some embodiments, an orthographic projection of the etch stop layer ESL on the base substrate BS covers an orthographic projection of the polycrystalline silicon part PS on the base substrate BS, and an orthographic projection of at least a portion of the amorphous silicon part ASP on the base substrate BS. The portion of the active layer covered by the etch stop layer ESL may be considered as a channel part of the active layer. Referring to FIG. 8A, FIG. 8B, and FIG. 6C, the channel part of the active layer in one example includes the polycrystalline silicon part PS, a first portion P1 and a second portion P2 of the amorphous silicon part ASP. The orthographic projection of the etch stop layer ESL on the base substrate BS covers orthographic projections of a first portion P1 and a second portion P2 of the amorphous silicon part on the base substrate BS, and covers the orthographic projection of the polycrystalline silicon part PS on the base substrate BS. The first portion P1 and the second portion P2 are respectively on two opposite sides of the polycrystalline silicon part PS. The first portion P1, the second portion P2, and the polycrystalline silicon part PS are in a same layer, are in direct contact with the etch stop layer ESL, and are on a side of the etch stop layer ESL closer to the base substrate BS.

In some embodiments, the amorphous silicon part ASP includes a first amorphous silicon layer ASL1 and a second amorphous silicon layer ASL2. The first amorphous silicon layer ASL1 is in a same layer as the polycrystalline silicon part PS, and consists of the first portion P1 and the second portion P2. The second amorphous silicon layer ASL2 is on a side of the etch stop layer ESL away from the base substrate BS.

Referring to FIG. 8A and FIG. 8B, the first amorphous silicon layer ASL1 in some embodiments consists of the first portion P1 and the second portion P2. Optionally, the first portion P1, the polycrystalline silicon part PS, and the second portion P2 are sequentially arranged along the channel width direction CWD. Along the channel length direction CLD, each of the polycrystalline silicon part PS, the first portion P1, and the second portion P2 has a dimension substantially same as a dimension of the etch stop layer ESL. Along the channel width direction CWS, a combination of the polycrystalline silicon part PS, the first portion P1, and the second portion P2 has a dimension substantially same as a dimension of the etch stop layer ESL. An orthographic projection of the etch stop layer ESL on the base substrate BS substantially overlaps with an orthographic projection of the combination of the polycrystalline silicon part PS, the first portion P1, and the second portion P2 on the base substrate BS.

As used herein, the term "channel length" is intended to mean a dimension of a channel part of a thin film transistor, wherein the dimension represents a minimum distance between a source electrode contact part and a drain electrode contact part. From a top view, the channel length is typically in a direction that is substantially perpendicular to channel-source interface, channel-drain interface, channel-source/drain interface, or the like. Optionally, the channel length describes the dimension of the channel part in a direction parallel to the designed direction of carrier flow when the channel part is "on". For example, the channel length can be the shortest distance from one source/drain region of a transistor to the other. As used herein, the term "channel width" is intended to mean a dimension of a channel part of a thin film transistor, wherein the dimension is measured in a direction substantially perpendicular to the channel length. From a top view, the channel width typically extends from one channel region-field isolation region interface to an opposite channel region-field isolation region interface. Optionally, the channel width describes the dimension of the channel part in a direction perpendicular to the designed direction of carrier flow when the channel part is "on".

In one example, the channel width direction CWD is substantially parallel to a direction along which the first portion P1, the polycrystalline silicon part PS, and the second portion P2 are sequentially arranged. In another example, the channel length direction CLD is substantially perpendicular to the direction along which the first portion P1, the polycrystalline silicon part PS, and the second portion P2 are sequentially arranged. In another example, the channel length direction CLD is substantially parallel to a direction along which the source electrode S and the drain electrode D are arranged.

In some embodiments, the second amorphous silicon layer ASL2 includes a third portion P3 and a fourth portion P4. The third portion P3 is in direct contact with the first portion P1. The fourth portion P4 is in direct contact with the second portion P2. Optionally, the first portion P1, the second portion P2, the third portion P3, the fourth portion P4, and the polycrystalline silicon part PS are in direct contact with the gate insulating layer GI. Optionally, each of the first portion P1, the second portion P2, the third portion P3, the fourth portion P4, and the polycrystalline silicon part PS is on a surface of a same layer, e.g., on a surface of the gate insulating layer GI.

Figure 9:
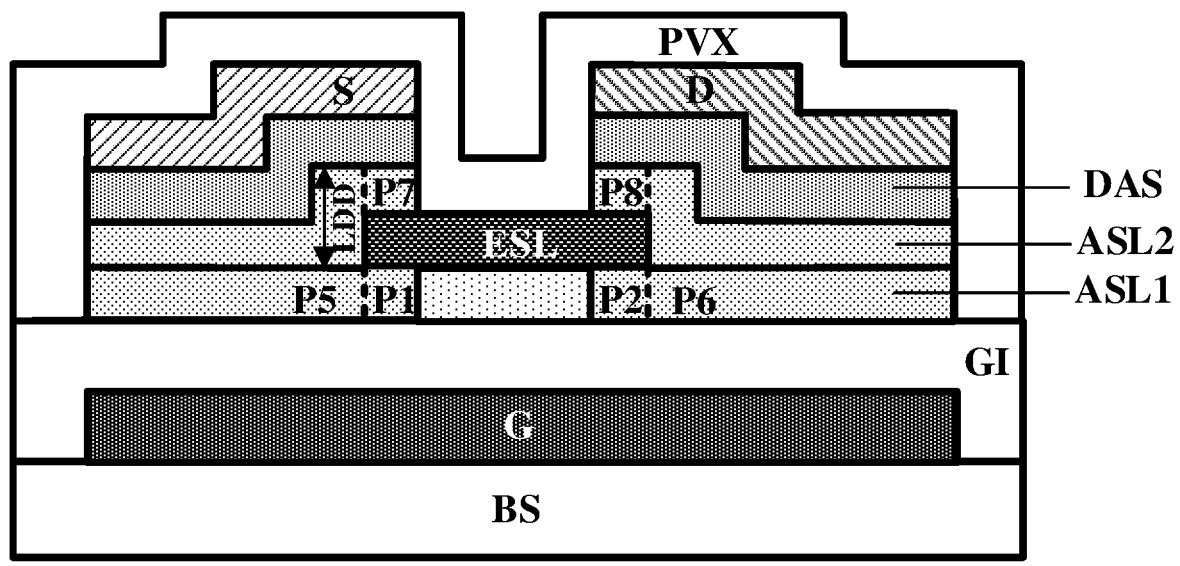
FIG. 9 is a schematic diagram illustrating the structure of a thin film transistor in some embodiments according to the present disclosure.

FIG. 9 is a schematic diagram illustrating the structure of a thin film transistor in some embodiments according to the present disclosure. Referring to FIG. 9, the amorphous silicon part ASP in some embodiments includes a first amorphous silicon layer ASL1 and a second amorphous silicon layer ASL2. The first amorphous silicon layer ASL1 includes a first portion P1, a second portion P2, a first portion P5, and a sixth portion P6. The fifth portion P5 is in direct contact with the first portion P1. The sixth portion P6 is in direct contact with the second portion P2. Optionally, the first portion P1, the second portion P2, the fifth portion P5, the sixth portion P6, and the polycrystalline silicon part PS are in direct contact with the gate insulating layer GI. Optionally, the second amorphous silicon layer ASL2 is in direct contact with the fifth portion P5, and in direct contact with the sixth portion P6. Optionally, each of the first portion P1, the second portion P2, the fifth portion P5, the sixth portion P6, and the polycrystalline silicon part PS is on a surface of a same layer, e.g., on a surface of the gate insulating layer GI.

Referring to FIG. 5A, FIG. 8A, and FIG. 9, the second amorphous silicon layer ASL2 in some embodiments includes a seventh portion P7 and an eighth portion P8. Optionally, the seventh portion P7 is on a side of the etch stop layer ESL away from the first portion P1; and the eighth portion P8 is on a side of the etch stop layer ESL away from the second portion P2. Optionally, an orthographic projection of the seventh portion P7 on the base substrate BS at least partially overlaps with an orthographic projection of the first portion P1 on the base substrate BS; and an orthographic projection of the eighth portion P8 on the base substrate BS at least partially overlaps with an orthographic projection of the second portion P2 on the base substrate BS.

Referring to FIG. 5A, FIG. 8A, and FIG. 9, the thin film transistor in some embodiments further includes a doped amorphous silicon layer DAS on a side of the etch stop layer ESL away from the base substrate BS. Optionally, the doped amorphous silicon layer DAS is between the source electrode S and the second amorphous silicon layer ASL2, and between the drain electrode D and the second amorphous silicon layer ASL2. Optionally, the doped amorphous silicon layer DAS is a heavily doped amorphous silicon layer. Optionally, the doped amorphous silicon layer DAS is in direct contact with the source electrode S, in direct contact with the drain electrode D. and in direct contact with the second amorphous silicon layer ASL2.

Optionally, the thin film transistor in some embodiments further includes a passivation layer PVX on a side of the source electrode S and the drain electrode D away from the base substrate BS.

Figure 10:
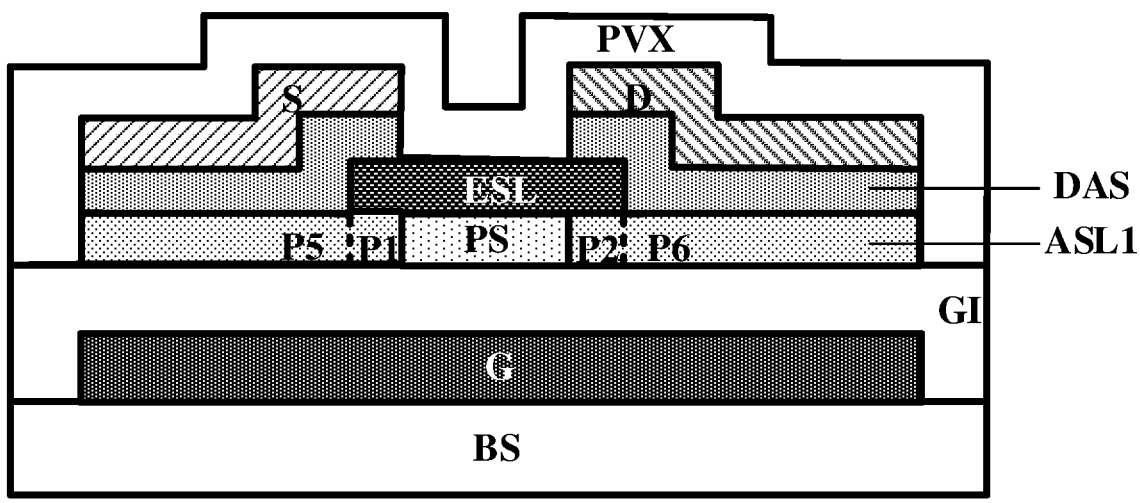
FIG. 10 is a schematic diagram illustrating the structure of a thin film transistor in some embodiments according to the present disclosure.

FIG. 10 is a schematic diagram illustrating the structure of a thin film transistor in some embodiments according to the present disclosure. Referring to FIG. 10, the amorphous silicon part consists of a first amorphous silicon layer ASL1 (e.g., the thin film transistor does not include a second amorphous silicon layer). Optionally, the first amorphous silicon layer ASL1 is in a same layer as the polycrystalline silicon part PS. The first amorphous silicon layer ASL1 includes the first portion P1, the second portion P2, a fifth portion P5, and a sixth portion P6. Optionally, the fifth portion P5 is in direct contact with the first portion P1; and the sixth portion P6 is in direct contact with the second portion P2. Optionally, the first portion P1, the second portion P2, the fifth portion P5, the sixth portion P6, and the polycrystalline silicon part PS are in direct contact with the gate insulating layer GI. Optionally, each of the first portion P1, the second portion P2, the fifth portion P5, the sixth portion P6, and the polycrystalline silicon part PS is on a surface of a same layer, e.g., on a surface of the gate insulating layer GI.

In some embodiments, the thin film transistor further includes a doped amorphous silicon layer DAS on a side of the etch stop layer ESL away from the base substrate BS. Optionally, the doped amorphous silicon layer DAS is between the source electrode S and the first amorphous silicon layer ASL1, and between the drain electrode D and the first amorphous silicon layer ASL1. Optionally, the doped amorphous silicon layer DAS is a heavily doped amorphous silicon layer. Optionally, the doped amorphous silicon layer DAS is in direct contact with the source electrode S, in direct contact with the drain electrode D, and in direct contact with the first amorphous silicon layer ASL1.

Figure 11:
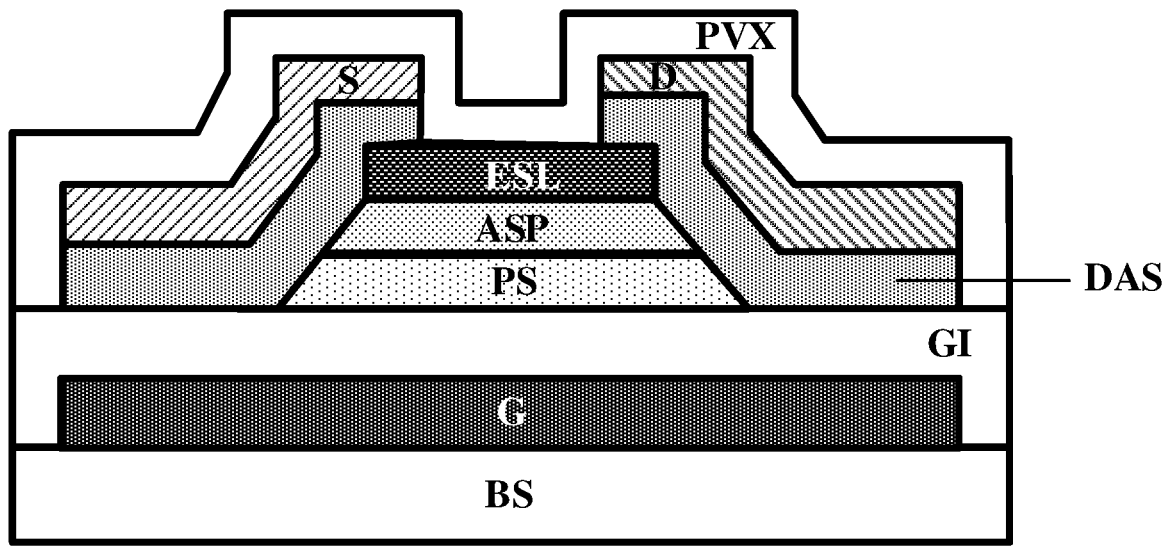
FIG. 11 is a schematic diagram illustrating the structure of a thin film transistor in some embodiments according to the present disclosure.
Figure 12A:
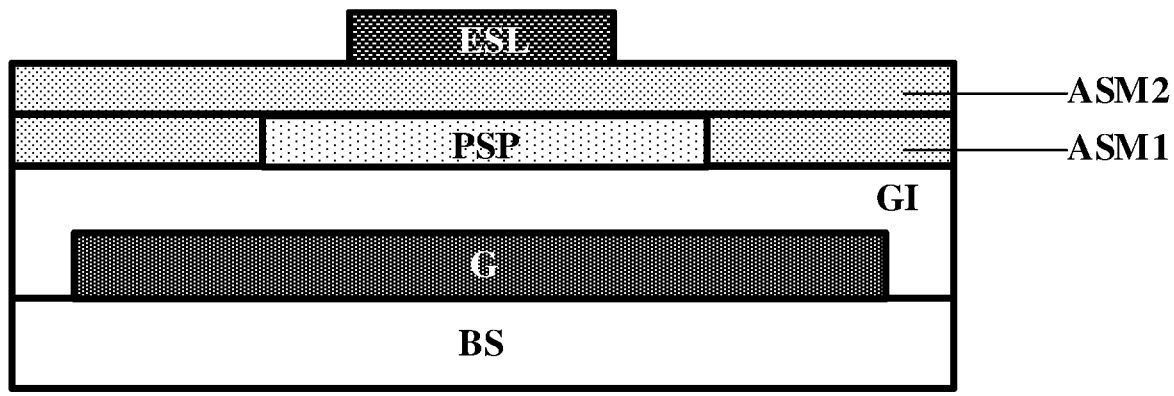
FIG. 12A to 12B illustrate a method of fabricating a thin film transistor in some embodiments according to the present disclosure.
Figure 12B:
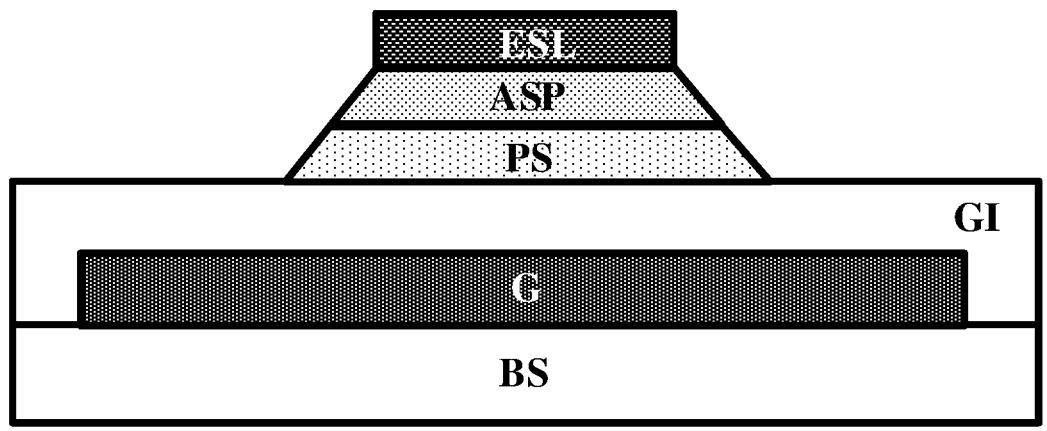

FIG. 11 is a schematic diagram illustrating the structure of a thin film transistor in some embodiments according to the present disclosure. Referring to FIG. 11, the amorphous silicon part ASP is on a side of the polycrystalline silicon part PS away from the base substrate BS. FIG. 12A to 12B illustrate a method of fabricating a thin film transistor in some embodiments according to the present disclosure. Referring to FIG. 12A, a first amorphous silicon material layer ASM1 is deposited on the base substrate BS; a part of the first amorphous silicon material layer ASM1 is crystallized into the polycrystalline silicon material, forming a polycrystalline silicon material portion PSP; a second amorphous silicon material layer ASM2 is deposited on a side of the first amorphous silicon material layer ASM1 away from the base substrate BS; and an etch stop layer ESL is formed on a side of the second amorphous silicon material layer ASM2 away from the polycrystalline silicon material portion PSP. Referring to FIG. 12B, the first amorphous silicon material layer and the second amorphous silicon material layer are patterned using the etch stop layer ESL as a mask plate, forming a polycrystalline silicon part PS and an amorphous silicon part ASP.

Referring to FIG. 11, FIG. 12A, and FIG. 12B, the amorphous silicon part ASP is formed on a side of the polycrystalline silicon part PS away from the base substrate BS; the etch stop layer ESL is formed on a side of the amorphous silicon part ASP away from the polycrystalline silicon part PS; and the amorphous silicon part ASP spaces apart the etch stop layer ESL from the polycrystalline silicon part PS.

Referring to FIG. 11, the thin film transistor in some embodiments further includes a doped amorphous silicon layer DAS on a side of the etch stop layer ESL away from the base substrate BS. Optionally, the doped amorphous silicon layer DAS is between the source electrode S and the amorphous silicon part ASP, between the source electrode S and the polycrystalline silicon part PS, between the drain electrode D and the amorphous silicon part ASP, and between the drain electrode D and the polycrystalline silicon part PS. Optionally, the doped amorphous silicon layer DAS is in direct contact with the amorphous silicon part ASP, and is in direct contact with the polycrystalline silicon part PS.

In another aspect, the present disclosure provides a display apparatus including a display substrate having a thin film transistor described herein or fabricated by a method described herein, and one or more integrated circuits connected to the display substrate. The display substrate includes a plurality of thin film transistors arranged in an array, each of the plurality of thin film transistors may be implemented by the thin film transistor described herein or fabricated by a method described herein. Examples of appropriate display apparatuses include, but are not limited to, an electronic paper, a mobile phone, a tablet computer, a television, a monitor, a notebook computer, a digital album, a GPS, etc. Optionally, the display apparatus is an organic light emitting diode display apparatus. Optionally, the display apparatus is a liquid crystal display apparatus.

In another aspect, the present disclosure provides a method of fabricating a thin film transistor. In some embodiments, the method includes forming a gate electrode on a base substrate; forming an active layer on the base substrate, forming the active layer comprising forming a polycrystalline silicon part comprising a polycrystalline silicon material and forming an amorphous silicon part comprising an amorphous silicon material; forming a gate insulating layer, the gate insulating layer formed to insulate the gate electrode from the active layer; forming a source electrode and a drain electrode on the base substrate; and forming an etch stop layer on a side of the polycrystalline silicon part away from the base substrate. Optionally, an orthographic projection of the etch stop layer on the base substrate covers an orthographic projection of the polycrystalline silicon part on the base substrate, and an orthographic projection of at least a portion of the amorphous silicon part on the base substrate.

In some embodiments, forming the active layer includes depositing a first amorphous silicon material layer on the base substrate; and crystallizing a part of the first amorphous silicon material layer into the polycrystalline silicon material, thereby forming the polycrystalline silicon part. Optionally, the orthographic projection of the etch stop layer on the base substrate covers orthographic projections of the polycrystalline silicon part, and a first portion and a second portion of the first amorphous silicon material layer, on the base substrate. Optionally, the first portion and the second portion are respectively on two opposite sides of the polycrystalline silicon part. Optionally, the first portion, the second portion, and the polycrystalline silicon part are in a same layer, are in direct contact with the etch stop layer, and are on a side of the etch stop layer closer to the base substrate.

Various appropriate crystallization methods may be used for crystallizing the part of the first amorphous silicon material layer. Examples of crystallization methods includes excimer laser annealing (ELA), solid phase crystallization (SPC), sequential lateral solidification (SLS), metal induced crystallization (MIC), and metal-induced lateral crystallization (MILC). Optionally, the crystallization is performed using laser irradiation. In one example, the crystallization is performed using a micro laser array technique or a micro lens array technique. The micro lens array technique enables selectively annealing only a selected part (e.g., corresponding to a channel part of the active layer) of the amorphous silicon material layer. An irradiation region when the micro lens array technique is employed is not limited by a size of the substrate.

In some embodiments, subsequent to forming the etch stop layer, the method further includes forming a second amorphous silicon material layer on a side of the etch stop layer away from the base substrate; and patterning the second amorphous silicon material layer to form the second amorphous silicon layer.

In some embodiments, subsequent to crystallizing the part of the first amorphous silicon material layer and forming the etch stop layer, the method further includes patterning the first amorphous silicon material layer using the etch stop layer as a mask plate to remove portions uncovered by the etch stop layer, thereby forming a first amorphous silicon layer consisting of the first potion and the second portion. Optionally, the second amorphous silicon layer is formed to comprise a third portion and a fourth portion. Optionally, the third portion is formed to be in direct contact with the first portion. Optionally, the fourth portion is formed to be in direct contact with the second portion. Optionally, the first portion, the second portion, the third portion, the fourth portion, and the polycrystalline silicon part are formed to be in direct contact with the gate insulating layer.

In some embodiments, patterning the first amorphous silicon material layer forms the first amorphous silicon layer consisting of the first portion and the second portion. Optionally, the first portion, the polycrystalline silicon part, and the second portion are formed to be sequentially arranged along a channel width direction. Optionally, along a channel length direction, each of the polycrystalline silicon part, the first portion, and the second portion has a dimension substantially same as a dimension of the etch stop layer. Optionally, along the channel width direction, a combination of the polycrystalline silicon part, the first portion, and the second portion has a dimension substantially same as a dimension of the etch stop layer. Optionally, the orthographic projection of the etch stop layer on the base substrate substantially overlaps with an orthographic projection of the combination of the polycrystalline silicon part, the first portion, and the second portion on the base substrate.

In some embodiments, subsequent to crystallizing the part of the first amorphous silicon material layer, the method further includes patterning the first amorphous silicon material layer to form a first amorphous silicon layer comprising the first portion, the second portion, a fifth portion, and a sixth portion. Optionally, the fifth portion is formed to be in direct contact with the first portion. Optionally, the sixth portion is formed to be in direct contact with the second portion. Optionally, the first portion, the second portion, the fifth portion, the sixth portion, and the polycrystalline silicon part are formed to be in direct contact with the gate insulating layer. Optionally, the second amorphous silicon layer is formed to be in direct contact with the fifth portion, and in direct contact with the sixth portion.

In some embodiments, the method further includes forming a doped amorphous silicon layer on a side of the etch stop layer away from the base substrate. Optionally, the doped amorphous silicon layer is formed between the source electrode and the second amorphous silicon layer, and between the drain electrode and the second amorphous silicon layer.

In some embodiments, subsequent to crystallizing the part of the first amorphous silicon material layer, the method further includes patterning the first amorphous silicon material layer to form a first amorphous silicon layer comprising the first portion, the second portion, a fifth portion, and a sixth portion. Optionally, the fifth portion is formed to be in direct contact with the first portion. Optionally, the sixth portion is formed to be in direct contact with the second portion. Optionally, the first portion, the second portion, the fifth portion, the sixth portion, and the polycrystalline silicon part are formed to be in direct contact with the gate insulating layer. Optionally, the method further comprises forming a doped amorphous silicon layer on a side of the etch stop layer and the first amorphous silicon layer away from the base substrate. Optionally, the doped amorphous silicon layer is formed between the source electrode and the fifth portion, and between the drain electrode and the sixth portion.

In some embodiments, forming the active layer includes depositing a first amorphous silicon material layer on the base substrate; crystallizing a part of the first amorphous silicon material layer into the polycrystalline silicon material; depositing a second amorphous silicon material layer on a side of the first amorphous silicon material layer away from the base substrate; forming an etch stop layer on a side of the second amorphous silicon material layer away from the part of the first amorphous silicon material layer that is crystallized; and patterning the first amorphous silicon material layer and the second amorphous silicon material layer using the etch stop layer as a mask plate, thereby forming the polycrystalline silicon part and the amorphous silicon part. Optionally, the amorphous silicon part is formed on a side of the polycrystalline silicon part away from the base substrate. Optionally, the etch stop layer is formed on a side of the amorphous silicon part away from the polycrystalline silicon part. Optionally, the amorphous silicon part spaces apart the etch stop layer from the polycrystalline silicon part.

In some embodiments, the method further includes forming a doped amorphous silicon layer on a side of the etch stop layer away from the base substrate. Optionally, the doped amorphous silicon layer is formed between the source electrode and the amorphous silicon part, between the source electrode and the polycrystalline silicon part, between the drain electrode and the amorphous silicon part, and between the drain electrode and the polycrystalline silicon part. Optionally, the doped amorphous silicon layer is formed in direct contact with the amorphous silicon part, and is in direct contact with the polycrystalline silicon part.

Various appropriate conductive electrode materials and various appropriate fabricating methods may be used to make the gate electrode G. For example, a conductive electrode material may be deposited on the substrate by, e.g., sputtering or vapor deposition, and patterned by, e.g., lithography such as a wet etching process to form a gate electrode G. Examples of appropriate conductive electrode materials include, but are not limited to, aluminum, chromium, tungsten, titanium, tantalum, molybdenum, copper, and alloys or laminates containing the same. Optionally, the gate electrode G has a thickness in a range of 10 nm to 1000 nm, e.g., 10 nm to 100 nm, 100 nm to 200 nm, 200 nm to 300 nm, 300 nm to 400 nm, 400 nm to 500 nm, 500 nm to 600 nm, 600 nm to 700 nm, 700 nm to 800 nm, 800 nm to 900 nm, or 900 nm to 1000 nm.

Various appropriate insulating materials and various appropriate fabricating methods may be used to make the gate insulating layer GI. For example, an insulating material may be deposited on the substrate by a plasma-enhanced chemical vapor deposition process. Examples of materials suitable for making the gate insulating layer GI include, but are not limited to, silicon oxide (SiOx), silicon nitride (SiNy, e.g., $Si_3N_4$), silicon oxynitride ($SiO_xN_y$), and aluminum oxide. Optionally, the gate insulating layer GI may have a single-layer structure or a stacked-layer structure including two or more sub-layers (e.g., a stacked-layer structure including a silicon oxide sublayer and a silicon nitride sublayer). Optionally, the gate insulating layer GI has a thickness in a range of 10 nm to 1000 nm, e.g., 10 nm to 100 nm, 100 nm to 200 nm, 200 nm to 300 nm, 300 nm to 400 nm, 400 nm to 500 nm, 500 nm to 600 nm, 600 nm to 700 nm, 700 nm to 800 nm, 800 nm to 900 nm, or 900 nm to 1000 nm.

Optionally, the first amorphous silicon layer ASL1 has a thickness in a range of 10 nm to 1000 nm, e.g., 10 nm to 100 nm, 100 nm to 200 nm, 200 nm to 300 nm, 300 nm to 400 nm, 400 nm to 500 nm, 500 nm to 600 nm, 600 nm to 700 nm, 700 nm to 800 nm, 800 nm to 900 nm, or 900 nm to 1000 nm.

Optionally, the second amorphous silicon layer ASL2 has a thickness in a range of 10 nm to 1000 nm, e.g., 10 nm to 100 nm, 100 nm to 200 nm, 200 nm to 300 nm, 300 nm to 400 nm, 400 nm to 500 nm, 500 nm to 600 nm, 600 nm to 700 nm, 700 nm to 800 nm, 800 nm to 900 nm, or 900 nm to 1000 nm.

Optionally, the polycrystalline silicon part PS has a thickness in a range of 10 nm to 1000 nm, e.g., 10 nm to 100 nm, 100 nm to 200 nm, 200 nm to 300 nm, 300 nm to 400 nm, 400 nm to 500 nm, 500 nm to 600 nm, 600 nm to 700 nm, 700 nm to 800 nm, 800 nm to 900 nm, or 900 nm to 1000 nm.

Optionally, the doped amorphous silicon layer DAS has a thickness in a range of 10 nm to 1000 nm, e.g., 10 nm to 100 nm, 100 nm to 200 nm, 200 nm to 300 nm, 300 nm to 400 nm, 400 nm to 500 nm, 500 nm to 600 nm, 600 nm to 700 nm, 700 nm to 800 nm, 800 nm to 900 nm, or 900 nm to 1000 nm.

Various appropriate insulating materials and various appropriate fabricating methods may be used to make the etch stop layer ESL. For example, an insulating material may be deposited on the substrate by a plasma-enhanced chemical vapor deposition process. Examples of materials suitable for making the etch stop layer ESL include, but are not limited to, silicon oxide (SiOx), silicon nitride (SiNy, e.g., $Si_3N_4$), and silicon oxynitride ($SiO_xN_y$). Optionally, the etch stop layer ESL has a thickness in a range of 10 nm to 1000 nm, e.g., 10 nm to 100 nm, 100 nm to 200 nm, 200 nm to 300 nm, 300 nm to 400 nm, 400 nm to 500 nm, 500 nm to 600 nm, 600 nm to 700 nm, 700 nm to 800 nm, 800 nm to 900 nm, or 900 nm to 1000 nm.

Various appropriate conductive electrode materials and various appropriate fabricating methods may be used to make the source electrode S and the drain electrode D. In some embodiments, the conductive electrode material includes a metal material. Examples of appropriate metal materials include, but are not limited to, molybdenum, copper, and aluminum. Optionally, the source electrode S and the drain electrode D have a thickness in a range of 10 nm to 1000 nm, e.g., 10 nm to 100 nm, 100 nm to 200 nm, 200 nm to 300 nm, 300 nm to 400 nm, 400 nm to 500 nm, 500 nm to 600 nm, 600 nm to 700 nm, 700 nm to 800 nm, 800 nm to 900 nm, or 900 nm to 1000 nm.

Various appropriate insulating materials and various appropriate fabricating methods may be used to make the passivation layer PVX. For example, an insulating material may be deposited on the substrate by a plasma-enhanced chemical vapor deposition process. Examples of materials suitable for making the passivation layer PVX include, but are not limited to, silicon oxide (SiOx), silicon nitride (SiNy, e.g., $Si_3N_4$), silicon oxynitride ($SiO_xN_y$), and aluminum oxide. Optionally, the passivation layer PVX may have a single-layer structure or a stacked-layer structure including two or more sub-layers (e.g., a stacked-layer structure including a silicon oxide sublayer and a silicon nitride sublayer). Optionally, the passivation layer PVX has a thickness in a range of 10 nm to 1000 nm, e.g., 10 nm to 100 nm, 100 nm to 200 nm, 200 nm to 300 nm, 300 nm to 400 nm, 400 nm to 500 nm, 500 nm to 600 nm, 600 nm to 700 nm, 700 nm to 800 nm, 800 nm to 900 nm, or 900 nm to 1000 nm.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element.

Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A thin film transistor, comprising:
a base substrate;
a gate electrode on the base substrate;
a semiconductor layer on the base substrate, the semiconductor layer comprising a polycrystalline silicon part comprising a polycrystalline silicon material and an amorphous silicon part comprising an amorphous silicon material;
a gate insulating layer insulating the gate electrode from the semiconductor layer;
a source electrode and a drain electrode on the base substrate; and
an etch stop layer on a side of the polycrystalline silicon part away from the base substrate;
wherein an orthographic projection of the etch stop layer on the base substrate covers an orthographic projection of the polycrystalline silicon part on the base substrate, and an orthographic projection of at least a portion of the amorphous silicon part on the base substrate;
wherein the orthographic projection of the etch stop layer on the base substrate covers orthographic projections of a first portion and a second portion of the amorphous silicon part on the base substrate;
the polycrystalline silicon part comprises two main surfaces and multiple lateral surfaces;
the first portion and the second portion of the amorphous silicon part are respectively on two opposite lateral sides of the polycrystalline silicon part; and
the first portion, the second portion, and the polycrystalline silicon part are in a same layer, are in direct contact with the etch stop layer, and are on a side of the etch stop layer closer to the base substrate;
wherein the amorphous silicon part comprises a first amorphous silicon layer and a second amorphous silicon layer;
the first amorphous silicon layer is in a same layer as the polycrystalline silicon part, and comprising the first portion and the second portion; and
at least a portion of the second amorphous silicon layer is on a side of the etch stop layer away from the base substrate;
wherein the second amorphous silicon layer comprises a third portion and a fourth portion in a same layer as the first amorphous silicon layer;
a lateral surface of the third portion is in direct contact with a lateral surface of the first portion;
a lateral surface of the fourth portion is in direct contact with a lateral surface of the second portion; and
the first portion, the second portion, the third portion, the fourth portion, and the polycrystalline silicon part form a semiconductor material layer on a side of the gate insulating layer away from the base substrate.

2. The thin film transistor of claim 1, wherein the first amorphous silicon layer consists of the first portion and the second portion;
the first portion, the polycrystalline silicon part, and the second portion are sequentially arranged along a channel length direction;
along a channel width direction, each of the polycrystalline silicon part, the first portion, and the second portion has a length same as a length of the etch stop layer;
along the channel length direction, a combination of the polycrystalline silicon part, the first portion, and the second portion forms a semiconductor material layer having a length same as a length of the etch stop layer; and
the orthographic projection of the etch stop layer on the base substrate overlaps with an orthographic projection of the semiconductor material layer formed by the combination of the polycrystalline silicon part, the first portion, and the second portion on the base substrate.

3. The thin film transistor of claim 1, wherein the first amorphous silicon layer further comprising a fifth portion and a sixth portion;
a lateral surface of the fifth portion is in direct contact with a lateral surface of the first portion, the fifth portion and the first portion being in a same layer and parts of a unitary structure;
a lateral surface of the sixth portion is in direct contact with a lateral surface of the second portion, the sixth portion and the second portion being in a same layer and parts of a unitary structure;
the first portion, the second portion, the fifth portion, the sixth portion, and the polycrystalline silicon part form a semiconductor material layer on a side of the gate insulating layer away from the base substrate; and
the second amorphous silicon layer is on a side of the etch stop layer away from the base substrate, and on a side of main surfaces of the fifth portion and the sixth portion away from the base substrate.

4. The thin film transistor of claim 1, wherein the second amorphous silicon layer comprises a seventh portion and an eighth portion;
the seventh portion is on a side of the etch stop layer away from the first portion;
the eighth portion is on a side of the etch stop layer away from the second portion;
an orthographic projection of the seventh portion on the base substrate at least partially overlaps with an orthographic projection of the first portion on the base substrate; and
an orthographic projection of the eighth portion on the base substrate at least partially overlaps with an orthographic projection of the second portion on the base substrate.

5. The thin film transistor of claim 1, further comprising a doped amorphous silicon layer on a side of the etch stop layer away from the base substrate;
wherein the doped amorphous silicon layer is between the source electrode and the second amorphous silicon layer, and between the drain electrode and the second amorphous silicon layer.

6. The thin film transistor of claim 5, further comprising a doped amorphous silicon layer on a side of the etch stop layer away from the base substrate;

wherein the doped amorphous silicon layer is between the source electrode and the first amorphous silicon layer, and between the drain electrode and the first amorphous silicon layer.

7. The thin film transistor of claim 1, wherein the amorphous silicon part consists of a first amorphous silicon layer;
the first amorphous silicon layer is in a same layer as the polycrystalline silicon part, and comprising the first portion, the second portion, a fifth portion, and a sixth portion;
the fifth portion is in direct contact with the first portion;
the sixth portion is in direct contact with the second portion; and
the first portion, the second portion, the fifth portion, the sixth portion, and the polycrystalline silicon part are in direct contact with the gate insulating layer.

8. A display apparatus, comprising a display substrate comprising a thin film transistor of claim 1, and one or more integrated circuits connected to the display substrate.

9. A method of fabricating a thin film transistor, comprising:
forming a gate electrode on a base substrate;
forming a semiconductor layer on the base substrate, forming the semiconductor layer comprising forming a polycrystalline silicon part comprising a polycrystalline silicon material and forming an amorphous silicon part comprising an amorphous silicon material;
forming a gate insulating layer, the gate insulating layer formed to insulate the gate electrode from the semiconductor layer;
forming an etch stop layer on a side of the polycrystalline silicon part away from the base substrate; and
forming a source electrode and a drain electrode on the base substrate;
wherein an orthographic projection of the etch stop layer on the base substrate covers an orthographic projection of the polycrystalline silicon part on the base substrate, and an orthographic projection of at least a portion of the amorphous silicon part on the base substrate;
wherein forming the semiconductor layer comprises:
depositing a first amorphous silicon material layer on the base substrate; and
crystallizing a part of the first amorphous silicon material layer into the polycrystalline silicon material, thereby forming the polycrystalline silicon part;
wherein the orthographic projection of the etch stop layer on the base substrate covers orthographic projections of the polycrystalline silicon part, and a first portion and a second portion of the first amorphous silicon material layer, on the base substrate;
the polycrystalline silicon part is formed to comprise two main surfaces and multiple lateral surfaces;
the first portion and the second portion of the amorphous silicon part are respectively on two opposite lateral sides of the polycrystalline silicon part; and
the first portion, the second portion, and the polycrystalline silicon part are in a same layer, are in direct contact with the etch stop layer, and are on a side of the etch stop layer closer to the base substrate;
wherein, subsequent to forming the etch stop layer, the method further comprises forming a second amorphous silicon material layer on a side of the etch stop layer away from the base substrate; and
patterning the second amorphous silicon material layer to form a second amorphous silicon layer;

wherein, subsequent to crystallizing the part of the first amorphous silicon material layer and forming the etch stop layer, the method further comprises:
patterning the first amorphous silicon material layer to remove portions uncovered by the etch stop layer, thereby forming a first amorphous silicon layer comprising the first portion and the second portion;
wherein the second amorphous silicon layer is formed to comprise a third portion and a fourth portion in a same layer as the first amorphous silicon layer;
a lateral surface of the third portion is formed to be in direct contact with a lateral surface of the first portion;
a lateral surface of the fourth portion is formed to be in direct contact with a lateral surface of the second portion; and
the first portion, the second portion, the third portion, the fourth portion, and the polycrystalline silicon part are formed as a semiconductor material layer on a side of the gate insulating layer away from the base substrate.

10. The method of claim 9, wherein patterning the first amorphous silicon material layer forms the first amorphous silicon layer consisting of the first portion and the second portion;
the first portion, the polycrystalline silicon part, and the second portion are formed to be sequentially arranged along a channel length direction;
along a channel width direction, each of the polycrystalline silicon part, the first portion, and the second portion has a length same as a length of the etch stop layer;
along the channel length direction, a combination of the polycrystalline silicon part, the first portion, and the second portion forms a semiconductor material layer having a length same as a length of the etch stop layer; and
the orthographic projection of the etch stop layer on the base substrate overlaps with an orthographic projection of the semiconductor material layer formed by the combination of the polycrystalline silicon part, the first portion, and the second portion on the base substrate.

11. The method of claim 9, subsequent to crystallizing the part of the first amorphous silicon material layer, further comprising patterning the first amorphous silicon material layer to form a first amorphous silicon layer comprising the first portion, the second portion, a fifth portion, and a sixth portion;
wherein a lateral surface of the fifth portion is formed to be in direct contact with a lateral surface of the first portion, the fifth portion and the first portion being in a same layer and parts of a unitary structure;
a lateral surface of the sixth portion is formed to be in direct contact with a lateral surface of the second portion, the sixth portion and the second portion being in a same layer and parts of a unitary structure;
the first portion, the second portion, the fifth portion, the sixth portion, and the polycrystalline silicon part are formed as a semiconductor material layer on a side of the gate insulating layer away from the base substrate; and
the second amorphous silicon layer is formed on a side of the etch stop layer away from the base substrate, and on a side of main surfaces of the fifth portion and the sixth portion away from the base substrate.

12. The method of claim 9, further comprising forming a doped amorphous silicon layer on a side of the etch stop layer away from the base substrate;

wherein the doped amorphous silicon layer is formed between the source electrode and the second amorphous silicon layer, and between the drain electrode and the second amorphous silicon layer.

13. The method of claim 9, subsequent to crystallizing the part of the first amorphous silicon material layer, further comprising patterning the first amorphous silicon material layer to form a first amorphous silicon layer comprising the first portion, the second portion, a fifth portion, and a sixth portion;
- wherein the fifth portion is formed to be in direct contact with the first portion;
- the sixth portion is formed to be in direct contact with the second portion; and
- the first portion, the second portion, the fifth portion, the sixth portion, and the polycrystalline silicon part are formed to be in direct contact with the gate insulating layer;
- the method further comprises forming a doped amorphous silicon layer on a side of the etch stop layer and the first amorphous silicon layer away from the base substrate;
- wherein the doped amorphous silicon layer is formed between the source electrode and the fifth portion, and between the drain electrode and the sixth portion.

* * * * *